United States Patent
Ludwig

(10) Patent No.: US 10,509,087 B2
(45) Date of Patent: Dec. 17, 2019

(54) FLEXIBLE MEASUREMENT PROTOCOL FOR MEDICAL IMAGING

(71) Applicant: Siemens Healthcare GmbH, Erlangen (DE)

(72) Inventor: Klaus Ludwig, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 215 days.

(21) Appl. No.: 15/587,529

(22) Filed: May 5, 2017

(65) Prior Publication Data

US 2017/0322278 A1 Nov. 9, 2017

(30) Foreign Application Priority Data

May 6, 2016 (DE) .................. 10 2016 207 848

(51) Int. Cl.
*G01R 33/54* (2006.01)
*G01R 33/36* (2006.01)
*G01R 33/341* (2006.01)

(52) U.S. Cl.
CPC ......... *G01R 33/543* (2013.01); *G01R 33/341* (2013.01); *G01R 33/3614* (2013.01)

(58) Field of Classification Search
CPC . G01R 33/543; G01R 33/341; G01R 33/3614
See application file for complete search history.

(56) References Cited

U.S. PATENT DOCUMENTS

| | | | |
|---|---|---|---|
| 7,902,821 B2 | 3/2011 | Nistler | |
| 7,902,831 B2 | 3/2011 | Nistler | |
| 2007/0085537 A1* | 4/2007 | Feiweier | G01R 33/246 324/307 |
| 2007/0255128 A1* | 11/2007 | Nistler | G01R 33/246 600/410 |
| 2016/0092634 A1 | 3/2016 | Kroell | |

FOREIGN PATENT DOCUMENTS

| | | |
|---|---|---|
| DE | 102006017439 B3 | 10/2007 |
| DE | 102014219405 A1 | 3/2016 |

* cited by examiner

*Primary Examiner* — Patrick Assouad
*Assistant Examiner* — Haidong Zhang
(74) *Attorney, Agent, or Firm* — Schiff Hardin LLP

(57) ABSTRACT

In a method for generating a measurement protocol for medical imaging of an object under examination, measurement parameters of the measurement protocol are divided into a protocol structure with a base class and classes supplementing the base class. The base class includes only hardware-independent measurement parameters and the supplementary classes includes only hardware-specific measurement parameters. A method for transferring a measurement protocol, a measurement protocol generation computer, a measurement protocol conversion apparatus, and a medical imaging system make use of such a measurement protocol.

16 Claims, 7 Drawing Sheets

SC-T: ABC

SP: SP1: KN0815
    SP2: HD-ABC

HF-P: PS1: FW1
      PS1: L1
      PS2: FW2
      PS2: L2

GR: GR 123: GP 1
          ...
          GP n

FoV: 500 mm
SD: 1 mm
$d_S$ : 1 mm
$t_E$: T1, T2, w
$T_R$: 5 ms
OR: sag
ST: SE
BA: 128
FW: 60°

FIG 2

Prior art

MP2

SC-T: DEF

SP: SP1: KN0815
    SP2: HD-BIG

HF-P: PS1: FW1
      PS1: L1'
      PS2: FW2
      PS2: L2'

GR: GR 456: GP 1'
       ...
       GP n'

FoV: 500 mm
SD: 1 mm
$d_S$ : 1 mm
$t_E$: T1, T2, w
$T_R$: 5 ms
OR: sag
ST: SE
BA: 128
FW: 60°

KT
FoV: 500 mm
SD: 1 mm
$d_S$ : 1 mm
$t_E$: T1, T2, w
$T_R$: 5 ms
OR: sag
ST: SE
BA: 128
FW: 60°

SPU

SPT1 (KOS)
SPT2 (KNS)
...
SPTn (BDR)

SP(ABC)

SC-T: ABC

SP: SP1: KN0815
     SP2: HD-ABC

HF-P(10000W)

HFV-T: 10000 W

HF-P: PS1: FW1
      PS1: L1
      PS2: FW2
      PS2: L2

GR(ABC, 123)

SC-T: ABC
GRD: 123

GR: GP 1
    ...
    GP n

FLEXIBLE MEASUREMENT PROTOCOL FOR MEDICAL IMAGING

BACKGROUND OF THE INVENTION

Field of the Invention

The invention concerns a method for creating a measurement protocol for medical imaging. Furthermore, the invention concerns a method for transferring a measurement protocol from a medical imaging apparatus of a first type to a medical imaging apparatus of a second type. Moreover, the invention relates to a measurement protocol generation computer. Furthermore, the invention relates to a measurement protocol conversion apparatus. Finally, the invention also relates to a medical imaging apparatus.

Description of the Prior Art

With the use of modern imaging methods, two-dimensional or three-dimensional image data are often generated, which can be used for visualization of a depicted object under examination, and furthermore for additional purposes.

A method for imaging the inside of a patient is based on magnetic resonance measurement (scan). Magnetic resonance tomography systems are successfully established and have proven their value through numerous applications. With this kind of image acquisition, a static basic magnetic field $B_0$, which is used for the initial alignment and homogenization of magnetic dipoles (nuclear spins) for examination, is usually overlaid with a rapidly switched magnetic field, the so-called gradient field, for spatial resolution of the imaging signal. To determine the material properties of an object under examination to be depicted, the nuclear spins are deflected from the initial alignment and the dephasing or relaxation time after this deflection is ascertained, so that various relaxation mechanisms or relaxation times typical of the material can be identified. Deflection usually occurs by a number of RF pulses, and spatial resolution is based on timed manipulation of the deflected magnetization by the gradient field in a so-called measuring sequence or control sequence, which establishes a precise chronological sequence of RF pulses, the alteration of the gradient field (through emission of a switch sequence of gradient pulses), and the recording of measured values.

Imaging methods are also known that are based on the recording of X-rays, so-called projection measurement data being generated. For example, projection measurement data can be acquired with a computed tomography system (CT system). In CT systems, an X-ray source and an X-ray detector are arranged opposite each other on a gantry, and usually revolve around a measuring area in which the object under examination (which is described hereinafter as a patient without loss of generality) is located. The center of rotation (also called "isocenter") coincides with a so-called system axis z. In one or more revolutions, the patient is irradiated with X-rays from the X-ray source, and projection measurement data or X-ray projection data are recorded with the aid of the X-ray detector opposite thereto.

The generated projection measurement data, also called projection data for short, is particularly dependent on the design of the X-ray detector. X-ray detectors usually have a number of detection units, which are usually arranged in the form of a regular pixel array. The detection units each generate a detection signal for X-rays impinging on the detection units, which is analyzed at certain times in terms of intensity and spectral distribution of the X-rays in order to obtain information about the object under examination and to generate projection measurement data.

To perform the imaging method described, measurement protocols must be created in advance, with which many different recording parameters, hereinafter also called measurement parameters, are established.

In present-day hospitals or institutes with medical imaging apparatuses, it is customary to use previously developed measurement protocols on other, for example, newer scan units. If an institute has a large fleet of different scan units, routine protocols are often forwarded to certain scan units and from there in turn to other scan units.

Conventionally, measurement protocols have always been saved with all the parameters necessary for the current scan unit of a current medical imaging apparatus and only for this, in order to be able to use them again on other scan units.

If the measurement protocols are used on scan unit types that correspond exactly to the original type, the entire parameter set can be used unchanged. No adjustment of separate interpretation of any kind is necessary. However, this is only possible for identical scan unit types. If a different type of scan unit is operated with this measurement protocol, several parameters that, for example, take into account specific hardware characteristics, must be altered or adjusted. This adjustment typically takes place on the target scan unit, with the parameter set being individually adjusted to the receiving imaging system.

If this new parameter set is now sent to another scan unit that is not identical to the transmitting scan unit, another parameter conversion/adjustment must be performed. Even if a measurement protocol is forwarded from scan unit type A→scan unit type B→scan unit type A, parameters are currently converted twice.

If the conversion is imprecise, this gradual parameter adjustment then leads to a change in the image quality or the visual impression of the measured images. Visible problems with regard to anticipated consistent visual impressions and the image quality result, particularly in an environment with very many different types of scan units. The structure of the measurement protocols used therefore has an indirect impact on the technical function of the imaging apparatuses.

SUMMARY OF THE INVENTION

It is an object of the present invention to provide a measurement protocol structure that is as flexible as possible, without this leading to a deterioration in image quality or discrepancies in general, particularly in the visual representation, as a result of the use of such a measurement protocol on various types of imaging apparatuses.

In the method according to the invention for generating a measurement protocol for the medical imaging of an object under examination, measurement parameters of the measurement protocol are divided into a protocol structure with a base class and classes supplementing the base class. Division takes place such that the base class includes only hardware-independent measurement parameters and the supplementary classes include only hardware-specific measurement parameters. The object-oriented division of the measurement parameters into a hierarchical class system results in measurement protocols only being subjected to an actual conversion, i.e. a parameter adjustment, when a property of a medical imaging system or its scan unit provided with the measurement protocol differs from all the scan units previously operated with the measurement protocol. The possibly newly adjusted parameters are then integrated into the measurement protocol from the original measurement protocol either by generating a new supplementary class and/or a manifestation of one of the existing classes or the new class. In this context, a manifestation of an existing class is to be understood as a manifestation that is generated by using type-specific parameter values for a certain class.

Consequently, the measurement protocol can then be used both on the new type of scan unit, and on the scan units previously used with the measurement protocol, without further conversion of measurement parameters. This means that with a new addition of measurement parameters or measurement parameter values, the old measurement parameters or measurement parameter values are retained as part of the classes or manifestations of classes. Hierarchical and, where applicable, also parallelized data structures therefore arise in which, through the retention of the old classes and exclusive supplementation of the existing structures by new classes and manifestations of classes, the overwriting of parameter values during transfer to another type of scan unit is avoided.

The protocol according to the invention measurement has a number of measurement parameters for the medical imaging of an object under examination. The measurement parameters of the measurement protocol are divided into a protocol structure with a base class and classes supplementing the base class such that the base class includes hardware-independent measurement parameters and the supplementary classes include only hardware-specific measurement parameters. An advantage of the protocol according to the invention measurement is that, based on the designations of the classes or manifestations of the classes, a control program of a scan unit can detect which of the manifestations or classes present in the measurement protocol can be used for a particular program version and a particular type of scan unit. Thus, for example, a conversion of a new type of scan unit or a newer program version with a greater number of parameters or functions to a previous type or an older program version is possible as on the older version the additional manifestations and classes only suitable for the newer version will then simply be ignored and only the classes or associated manifestations higher in the hierarchy of the class tree will be accessed. With conventional measurement protocols, by contrast, only one conversion of older versions to newer versions is possible because the older systems are "overstrained" by the excessively complex measurement protocol, i.e., the scan units are prompted by the measurement protocol to execute functions or set measurement parameters which they do not have at all.

In the method according to the invention for transferring a measurement protocol from a medical imaging apparatus of a first type to a medical imaging apparatus of a second type, it is first examined, in a computer, whether the measurement parameters used by the medical imaging apparatus of a second type are included in one of the classes encompassed by the measurement protocol. In the event that the measurement parameters are included in the measurement protocol, the classes included in the measurement protocol are used by the computer to formulate the measurement protocol for the medical imaging apparatus of the second type, as an output from the computer. In the event that the measurement parameters are not included in the measurement protocol, one or more classes with the measurement parameters used are generated from the specifications of the higher classes. Furthermore, the possibly modified measurement protocol is used on the medical imaging apparatus of a second type. In this way, the effort involved in the transfer of a measurement protocol to a scan unit of another type is minimized, because all the classes or their special manifestations are also used for the new scan unit that has parameter values corresponding to the parameter values of the new scan unit. Furthermore, the unnecessary creation of classes or manifestations of classes that already exist is avoided, thus saving processing work.

The measurement protocol generation computer according to the invention has an input interface for receiving measurement parameters to be transferred into a measurement protocol. It also has a parameters division processor for ascertaining whether a measurement parameter is a hardware-independent measurement parameter or a hardware-specific measurement parameter. Part of the measurement protocol generation computer according to the invention is also a class division processor for dividing the measurement parameters into a protocol structure with a base class and classes supplementing the base class such that the base class includes only hardware-independent measurement parameters and the supplementary classes include only hardware-specific measurement parameters. Furthermore, the measurement protocol generation computer according to the invention has an output interface for making the generated measurement protocol available in electronic form as an output.

The measurement protocol conversion apparatus according to the invention has an input interface for receiving a measurement protocol from a medical imaging apparatus of a first type. In addition, the measurement protocol conversion apparatus according to the invention has a test processor for testing whether the measurement parameter used by the medical imaging apparatus of a second type is included in one of the classes encompassed by the measurement protocol. Furthermore, the measurement protocol conversion apparatus according to the invention has a class generating processor for generating one or more classes with the measurement parameters used in the event that the measurement parameters are not included in the measurement protocol. Furthermore, the measurement protocol conversion apparatus according to the invention also has an output interface for providing the possibly modified measurement protocol as an output. The measurement protocol conversion apparatus according to the invention avoids overwriting of classes and manifestations unsuitable for the scan unit concerned so that with a renewed transfer of the measurement protocol to a scan unit of another type, the existing classes and parameters contained therein continue to be available. In this way, not only are errors avoided in the conversion of protocol parameters when transferring the measurement protocol from a scan unit of a first type to a scan unit of a second type but the effort involved in the transfer of a measurement protocol to a scan unit of another type is also minimized, because all the classes or their manifestations are also used for the new scan unit which has parameter values corresponding to the parameter values of the new scan unit. Furthermore, the unnecessary creation of classes or manifestations of classes which already exist is avoided, thus saving processing work.

The medical imaging apparatus according to the invention, preferably an MR system, has an MR scanner for scanning an examination area of an object under examination in order to obtain MR measurement data (raw MR data) from the examination area. It also has a control computer for controlling the scanner. In addition, the medical imaging apparatus according to the invention has a measurement protocol generation computer according to the invention and/or a measurement protocol conversion apparatus according to the invention.

MR systems have the advantage that an examination with them does not involve any exposure to X-rays and the soft tissue contrast of an image recording with an MR system is improved in comparison with a CT system.

Alternatively, the medical imaging apparatus may also be a computed tomography system. The implementation of the invention in a CT system has the advantage that the scan duration of a CT system is relatively short. It is only a few seconds compared to recording with MR systems, which may require several minutes. This is particularly advantageous when examining emergency patients for whom any delay can be life-threatening. In addition, CT systems are more widespread and are less expensive than MR systems.

The basic components of the measurement protocol generation device according to the invention and the measurement protocol conversion device according to the invention may be largely embodied in the form of software components. This relates to the parameter division processor, the class division processor, the test processor and the class generating processor. In principle, however, these components can also be partly realized in the form of software-supported hardware, for example, FPGAs, etc., particularly where especially fast calculations are involved. Likewise, the interfaces required can be embodied as software interfaces, for example, where it is only a matter of the transfer of data from other software components. However, they may also be embodied as hardware interfaces that are controlled by suitable software.

A realization which largely involves software has the advantage that control devices already used previously can also be easily upgraded by a software update to operate in the manner according to the invention. Therefore, the present invention also encompasses a non-transitory, computer-readable data storage medium encoded with programming instructions that, when the storage medium is loaded into a control computer of a medical image data acquisition apparatus, cause the control computer to operate the apparatus in order to implement the method in accordance with the invention as described above, by execution of the program code.

The computer-readable data storage medium can be, for example, a memory stick, a hard disk or another transportable or fixed data carrier on which the program code is stored.

The computer may have, for example, one or more cooperating microprocessors among which the program code is distributed upon loading of the storage medium into the computer.

Various features of different exemplary embodiments can be combined to form further exemplary embodiments.

In an embodiment of the method according to the invention for generating a measurement protocol for the medical imaging of an object under examination, the hardware-independent measurement parameters are clinical measurement parameters.

Clinical parameters are those that describe what is observed in the image and which properties one wishes to see in the image.

They therefore describe the visual impression, or the specific details which are to be viewed in the respective anatomy. They describe which anatomy/pathology is to be presented particularly well. High-contrast soft tissues can be preferably presented while other types of tissue are only poorly differentiated in the same presentation. This preference is reflected, for example, in CT imaging in acceleration voltage and in MR imaging, for instance, in the echo time. As it is still difficult to transfer certain soft tissue areas as "parameters" today, however, general but technical surrogate parameters, such as echo time, flip angle, etc. are used.

As the clinical parameters or their parameter values are only determined by the medical aspects of an examination of a patient and not by the technical circumstances of the medical imaging apparatus used, these parameters are not changed in a transfer from one medical imaging apparatus to another either. Therefore, these parameters can be summarized in a base class which is used unchanged by all the devices and program versions.

In a preferred embodiment of the method according to the invention for generating a measurement protocol for the medical imaging of an object under examination, the clinical measurement parameters are at least one of the following types of parameter:
Field of View,
Slice thickness,
Slice distance,
Echo time,
Repetition time,
Orientation,
Measurement sequence,
Image resolution,
Flip angle.

In an embodiment of the method according to the invention, the supplementary classes have separate classes for the following measurement parameters:
Coil types,
Coil parameters,
Gradient parameters,
RF amplifier parameters,
$B_0$ field strength parameters.

The aforementioned parameters are each dependent on the technical circumstances of a particular type of scan unit and may therefore change when a measurement protocol is transferred from a system of a first type to a system of a second type. Through the system of supplementary classes, parallel structures can be created which are also retained when the measurement protocol is transferred from a first type of scan unit to another second type of scan unit so that in a transfer from a scan unit of the second type to a scan unit of the first type, the old parameter values can be accessed without having to carry out a conversion of parameter values which could possibly lead to a distortion of the converted parameter values.

In an alternative version of the method according to the invention for generating a measurement protocol for the medical imaging of an object under examination, additional general parameters are added, wherein the hardware-independent general parameters are assigned to a base class for general parameters and the hardware-dependent general parameters are assigned to the classes supplementing the base class.

General parameters may relate, for example, to image triggering by cardiac or respiratory rhythm, the start of measurement after the administration of contrast medium, movement of the table for particularly large image sections or automatic image processing steps (for instance, an index correction).

In another embodiment of the method according to the invention, manifestations are generated by supplementary classes which are each assigned to a special type of medical imaging apparatus or a special type of functional unit of a medical imaging apparatus. The manifestations have specific parameter values for the specific types of functional unit.

In embodiments of the method according to the invention, the functional units may be:
RF coils,
Gradient coils,
RF amplifiers,
$B_0$ field coil.

The aforementioned functional units are specific to individual types of scan units and must therefore also be controlled with specific parameter values. The parameter values assigned to these functional units are therefore located in parallelized structures, i.e. specifically in supplementary classes.

In another embodiment of the method according to the invention, dependent parameters are assigned to the measurement protocol by the software version of an operating software of a medical imaging apparatus. The parameters valid for all the software versions are assigned to a basic parameter class and the parameters valid for part of the software version are assigned to the parameter classes supplementing the basic parameter class.

In this way, for example, a conversion of a newer program version with a greater number of parameters or functions to an older program version is easily possible as on the older version the additional manifestations of classes and classes only suitable for the newer version are then simply omitted and only the classes and associated manifestations of classes higher in the hierarchy of the class tree are accessed.

BRIEF DESCRIPTION OF THE DRAWINGS

FIG. 1 is a schematic illustration of a conventional measurement protocol for controlling a scan unit of an MR system of a first type.

FIG. 2 is a schematic illustration of a conventional measurement protocol for controlling a scan unit of an MR system of a second type.

FIG. 3 is a schematic illustration of a measurement protocol for controlling a scan unit of an MR system of a first type according to an exemplary embodiment of the invention.

DESCRIPTION OF THE PREFERRED EMBODIMENTS

Figure 4:
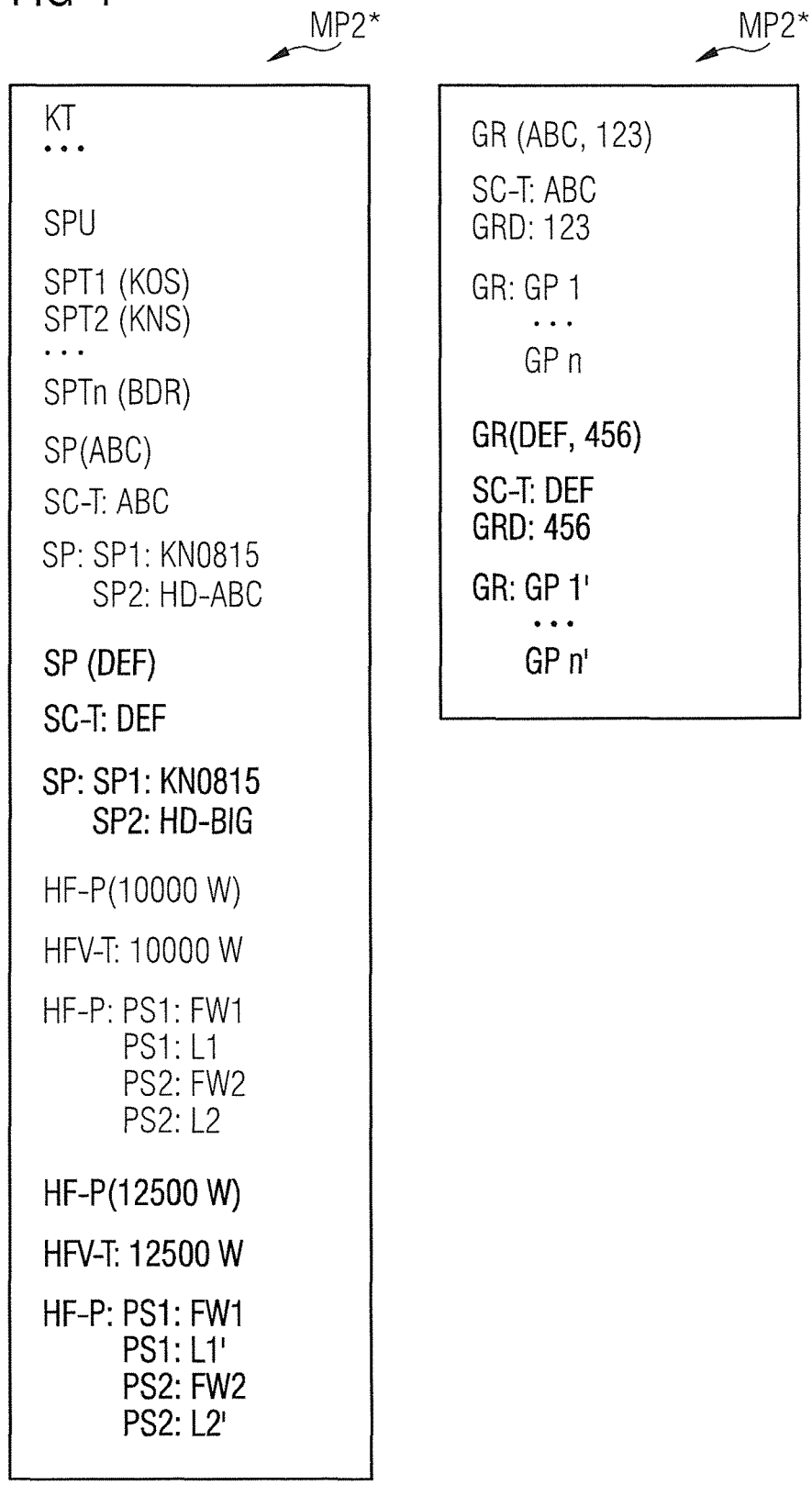
FIG. 4 is a schematic illustration of a measurement protocol for controlling a scan unit of an MR system of a second type according to an exemplary embodiment of the invention.

FIG. 1 shows a conventional measurement protocol MP1 for control of a magnetic resonance tomography system with an MR scanner of the scan unit type ABC. The designation of the scan unit type is saved under the heading SC-T, which stands for "scan unit type". Furthermore, the measurement protocol MP1 also comprises information about the coils SP of the scan unit ABC. The coil SP1 has the coil type KN0815 while the coil SP2 has the coil type HD-ABC. The designation "KN" is to indicate that the coil SP1 is a knee coil, the designation "HD" for the second coil SP is to indicate that the second coil is a head coil. In addition, the measurement protocol MP1 has the measurement parameter HF-P relating to the radio-frequency amplifier of the scanner. These measurement parameters HF-P relate to information about a first RF pulse PS1 and a second RF pulse PS2 which are part of a pulse sequence determined by the measurement protocol MP1. A parameter value FW1 for the flip angle to be achieved by this pulse PS1 and a parameter value L1 for the length of the pulse PS1 are assigned to the first RF pulse PS1. Likewise, a parameter value FW2 for the flip angle to be achieved by this pulse PS2 and a parameter value L2 for the length of the pulse PS2 are assigned to the second RF pulse PS2.

Furthermore, the conventional measurement protocol has information about the gradients GR to be used. The scan unit comprises gradients GRD of the configuration 123 with which gradient pulses GP1, . . . , GPn are employed.

The measurement protocol also includes additional general information, also called clinical parameters, which are independent of individual technical aspects of the scan unit and determine the view or geometry of the presentation of an MRT image. These measurement parameters comprise, inter alia, the Field of View FoV, the slice thickness SD of the slices to be imaged, the distance $d_S$ between individual slices, the echo time $t_E$, the repetition time $T_R$, the orientation OR of imaging, the image resolution BA and the flip angle FW. The values specified in the measurement protocol MP1 shown in FIG. 1 are arbitrary and are only used to illustrate the structure of the measurement protocol.

If the measurement protocol is now to be used on a second MR system with another scanner, for example, of the DEF type, then the measurement protocol MP1 must be translated into a corresponding format suitable for the other DEF-type scanner in order to obtain the same image result as in the scanner ABC of the first MR system.

FIG. 2 illustrates such a translated measurement protocol MP2 for a second MR system with a DEF-type scanner. As can be seen, the DEF scanner has, for example, a second coil SP2 with a different type of HD-BIG from the scanner ABC mentioned in the measurement protocol MP1 in FIG. 1. As a result, the DEF scanner also requires other HF-P RF parameters, at least with regard to the pulse length of the two coils PS1, PS2 which now have the values L1' or L2' instead of L1 or L2. The gradient system also has other gradient coils 456 now to which other gradient pulses GP1', . . . , GPn' are now assigned. In contrast, the clinical parameters FoV, SD, $d_S$, . . . remain unchanged as the image on the second MR system should remain unchanged and none of the clinical parameters are parameters dependent on the specific technical manifestation of an imaging apparatus.

If the converted measurement protocol MP2 is now transferred to a third MR system which, for example, has an ABC-type scanner, the altered parameters would have to be converted back again, wherein the necessary calculations may result in inaccuracies so that the measurement protocol parameters used for the control of the third MR system may differ from those for the control of the first MR system, although a scanner of the same type is used in both cases. The image is thus altered unintentionally by the transfer of the measurement protocol.

To overcome these difficulties, a measurement protocol MP1* shown in FIG. 3 is object-oriented in design according to an exemplary embodiment of the invention. The measurement protocol MP1* shown in FIG. 3 is likewise designed for the first MR system with an ABC-type scanner. A base class of the measurement protocol MP1* is formed by the "Clinical Part" KT class. This base class includes all the abstract parameters relating to image quality or image properties and independent of a particular technical manifestation of the MR system. These are, more specifically, the Field of View FoV, the slice thickness SD of the slices to be imaged, the distance $d_S$ between individual slices, the echo time $t_E$, the repetition time $T_R$, the orientation OR of the image, the image resolution BA and the flip angle FW. The base class KT therefore includes only parameters that assume the same values for all types of magnetic resonance scan unit and only depend on the desired image or their object and purpose.

Parameters with values which depend on the specific technical implementation of the image process are stored in supplementary classes SPU, SP, HF-P, GR. The SPU class supplements the KT base class, i.e. KT is valid alone, SPU not. However, the SPU class comprises detailed technical information, in this case, type designations for different coil types SPT1, . . . , SPTn.

For example, if a coil SPT1 is a so-called KOS head coil which is placed in the head region of a patient under examination. An SPT2 coil, on the other hand, is a KNS knee coil which is arranged in the knee region of the patient, and an SPTn-type coil is a body resonator, in other words, a BDR body coil. A further supplementary SP class, or in this case SP(ABC), is a special manifestation of the SP coil class for the special ABC-type scan unit. The class or manifestation SP(ABC) contains information about the SP1, SP2 coils and their type specifications encompassed by the ABC-type scanner. The SP(ABC) class therefore also refines the information of the KT base class.

This example involves a first KN0815-type SP1 coil used by the ABC scanner and a second HD-ABC SP2 second coil used by the ABC scanner. The KN0815 type is a knee coil and can be described, for example, by the SPT2 type specification specified in the coil class. The second coil SP2 is an HD-ABC head coil and can, for example, be specified by the SPT1 coil specification. The ABC, KN0815, HD-ABC data specified in the measurement protocol relates to specific information regarding the technical features of the scan unit used, in this case, the ABC scan unit.

By analogy, in the protocol MP1*, a further supplement of the KT base class, the radio-frequency parameter class HF-P for the specification of a radio-frequency amplifier used, is also specified. This HF-P class includes HFV-T information for the type of radio-frequency amplifier used and HF-P information for a first PS1 pulse to be generated and a second PS2 pulse to be generated. In each case, the flip angle FW1, FW2 and the pulse length L1, L2 used are listed. In FIG. 3 a special manifestation of the HF-P class, the HF-P(10000 W) class, is specified in the measurement protocol MP1*, including parameter values FW1, L1, FW2, L2 for a 10000-W RF amplifier.

Furthermore, in the measurement protocol MP1* in a GR gradient class likewise supplementing the KT base class or a manifestation GR(ABC, 123) of the GR class, SC-T type specifications are undertaken for an ABC-type scanner used and for a gradient coil 123 used. In addition, gradient pulses GP1, . . . , GPn to be emitted in the gradient class GR are specified. In the GR(ABC, 123) manifestation of the GR gradient class specified in FIG. 3, specific types of pulse GP1, . . . , GPn to be emitted to an ABC-type scanner with the gradient coil 123 are specified.

If such a first measurement protocol MP1* is now transferred from the first MR system with an ABC-type scanner to a second MR system with a DEF-type scanner, the control program of the second MR system detects that the SP(ABC) HF-P(10000 W), GR(ABC, 123) classes or manifestations of the SP, HF-P, GR classes present in the measurement protocol MP1* are not suitable for the DEF scanner and extends the measurement protocol MP1* by adding new SP(DEF), HF-P(12500 W), GR(DEF, 456) manifestations to a second measurement protocol MP2* which is shown in FIG. 4. The generation of the new SP(DEF), HF-P(12500 W), GR(DEF, 456) manifestations includes a change of individual parameters the calculation or conversion of which is undertaken by the program of the second MR system.

FIG. 4 illustrates the completed second measurement protocol MP2* for the second MR system. The second measurement protocol MP2* has the same KT base class as the first measurement protocol MP1*. Likewise, the second measurement protocol MP2* also comprises the manifestations SPU or concretions SP(ABC), HF-P(10000 W) and GR(ABC, 123) used by the first measurement protocol MP1*. In addition, however, concretions SPU(DEF), HF-P (12500 W) and GR(DEF, 456) provided with the converted parameters are added to the second measurement protocol MP2*. For example, the concretion or manifestation SPU (DEF) of the supplementary class SPU contains another scanner of the DEF type instead of a scanner of the ABC type. Although in the DEF-type scanner the first coil SP1 is likewise of the KN0815 type, the second coil SP2 is a different type from the ABC-type scanner, namely the HD-BIG type instead of the HD-ABC type. The new concretion HF-P(12500 W) of the 12500-W amplifier assigned to the DEF scanner has different pulse length values L1', L2' from the pulse length values L1, L2 assigned to the 10000-W amplifier of the ABC scanner. The new concretion GR(DEF, 456) of the GR gradient class also has another DEF-type scanner and another gradient coil type 456. Accordingly, the gradient pulses GR to be emitted have also changed. Instead of the previous GP1, GPn pulses, now GP1', . . . , GPn' pulses must be emitted.

If there is now a renewed transfer of the second measurement protocol MP2* to a third MR system with an ABC-type scanner, then the control program of the third MR system detects, by the names of the classes or arguments of the manifestations of classes, that SPU classes or manifestations of HF-P(10000 W), GR(ABC, 123) classes are already present in the measurement protocol MP2* for the ABC scanner of the third MR system, and no additional supplements or conversions of parameters or parameter values need be taken. Exactly the same parameter values are thus produced for the same imaging process for the first and the third MR system, and a different imaging result due to conversion errors or inaccuracies in calculation is thus avoided when using scanners of the same type. Furthermore, calculation time and effort spent on the renewed conversion of parameters is saved.

Figure 5:
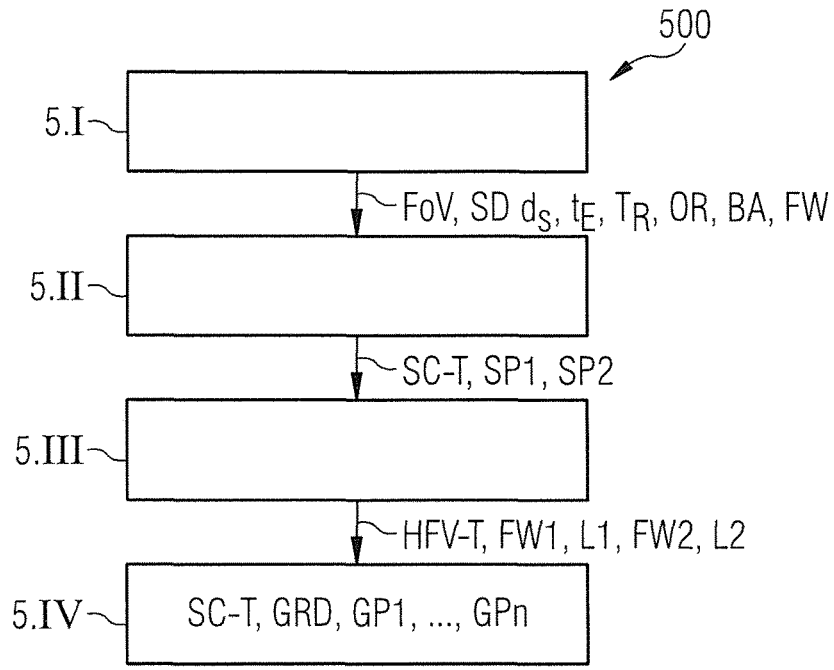
FIG. 5 is a flowchart of an embodiment of the method according to the invention for generating a measurement protocol for controlling an MR system.

FIG. 5 illustrates a method for generating a measurement protocol for the control of an MR system in a flow chart 500. In step 5.I, a number of hardware-independent measurement parameters FoV, SD $d_S$, $t_E$, $T_R$, OR, BA, FW are first saved for the medical imaging of an object under examination in a KT base class. Then in step 5.II hardware-specific measurement parameters, in this case coil parameters SC-T, SP1, SP2, are saved in a manifestation SP(SC-T) of the coil parameter class SP. Furthermore, in a step 5.III, RF amplifier parameters HFV-T, FW1, L1, FW2, L2 are saved in an HF-P(HFV-T) manifestation of a HF-P refining class relating to RF amplifier parameters. Subsequently, in a step 5.IV, gradient parameters SC-T, GRD, GP1, ..., GPn are stored in a manifestation GR(SC-T, GRD) of a gradient parameter class GR. The finished measurement protocol can then be processed by an SC-T scanner and also easily expanded or converted for other scanner types.

Figure 6:
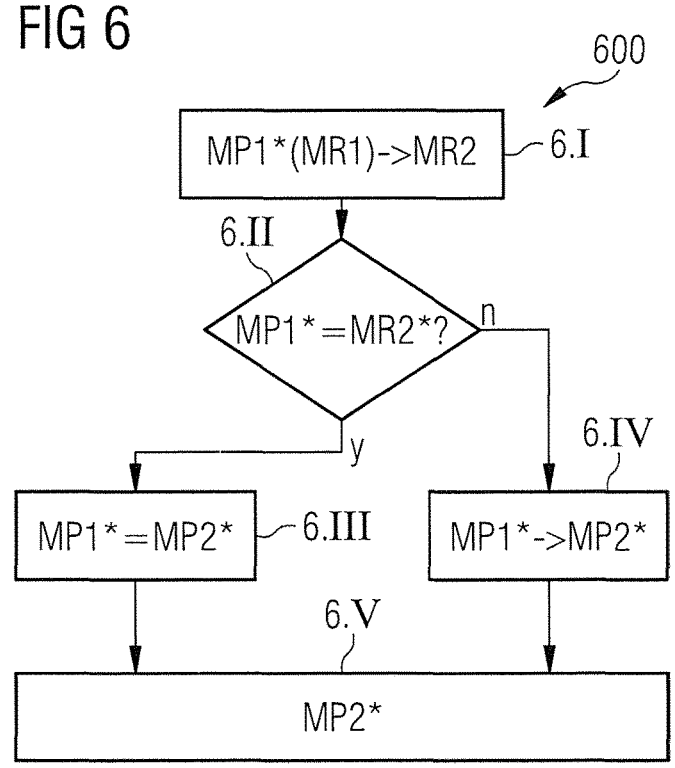
FIG. 6 is a flowchart of an embodiment of the method according to the invention for transferring a measurement protocol from an MR system of a first type to an MR system of a second type.

FIG. 6 shows a flowchart 600 that illustrates a method for transferring a measurement protocol from a first MR system of a first type to an MR system of a second type. In step 6.I a measurement protocol MP1* of the type shown in FIG. 3 is first transferred from a first MR system of a first type to a second MR system of a second type. There step 6.II examines whether the measurement parameters used by the second MR system are included in one of the classes encompassed by the measurement protocol MP1*. If this is the case, which is indicated by "y" in FIG. 6, then in step 6.III, the measurement protocol MP1* is adopted as a measurement protocol MP2* for the second MR system without the addition of new classes or specific manifestations of classes. If it is ascertained in step 6.II that the measurement parameter values for the second MR system are to be changed or even that completely new measurement parameters are required, which is indicated by "n" in FIG. 6, then in step 6.IV one or more new manifestations of classes are generated with converted measurement parameter values or even completely new classes supplementing the base class are generated with the new measurement parameters. Finally, in step 6.V the possibly modified measurement protocol MP2* is used on the second MR system.

Figure 7:
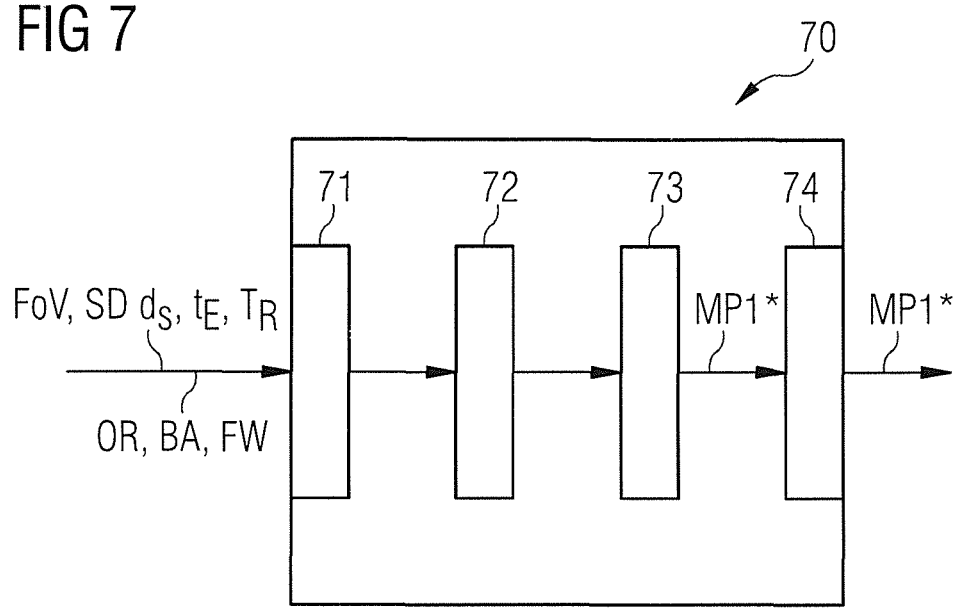
FIG. 7 is a block diagram that illustrates a measurement protocol generation computer according to an exemplary embodiment of the invention.

FIG. 7 shows a measurement protocol generation device 70 according to an exemplary embodiment of the invention. The measurement protocol generation device 70 has an input interface 71 for receiving measurement parameters FoV, SD $d_S$, $t_E$, $T_R$, OR, BA, FW for transfer into a measurement protocol MP1*. Part of the measurement protocol generation device 70 is also a parameter division unit 72. The parameter division unit 72 receives the input measurement parameters FoV, SD $d_S$, $t_E$, $T_R$, OR, BA, FW from the input interface 71 and ascertains whether a measurement parameter is a hardware-independent measurement parameter or a hardware-specific measurement parameter. Based on the result obtained from the parameter division unit 72, a class division unit 73 divides the measurement parameters into a protocol structure MP1* with a base class KT and the SPU, SP, HF-P, GR classes supplementing the base class. This is done such that the base class KT comprises hardware-independent measurement parameters FoV, SD $d_S$, $t_E$, $T_R$, OR, BA, FW and the supplementary classes SPU, SP, HF-P, GR comprise hardware-specific measurement parameters SC-T, SP1, SP2, FW1, FW2, L1, L2, GRD, GP1, ..., GPn. Moreover, the measurement protocol generation device 70 comprises an output interface 74 for output of the generated measurement protocol MP1*.

Figure 8:
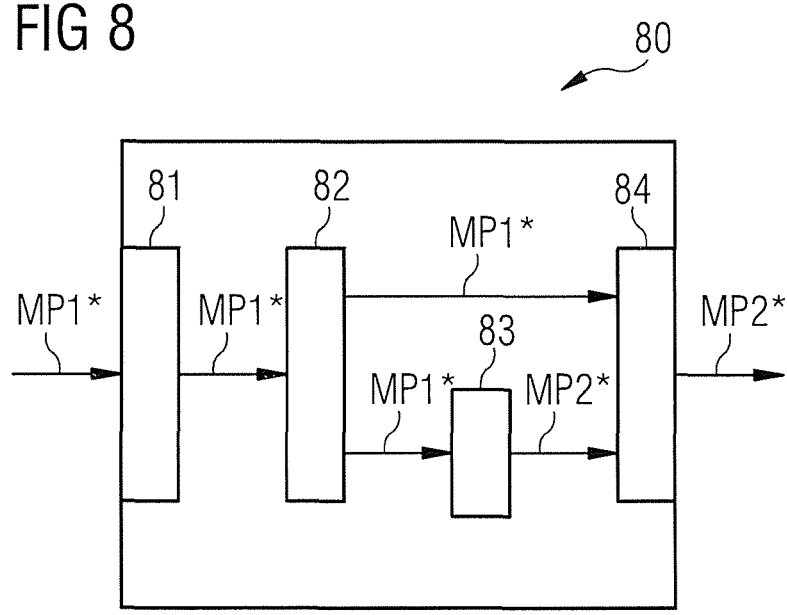
FIG. 8 is a block diagram that illustrates a measurement protocol conversion apparatus according to an exemplary embodiment of the invention.

FIG. 8 illustrates a measurement protocol conversion computer 80 according to an exemplary embodiment of the invention. The measurement protocol conversion device 80 has an input interface 81 for receiving a measurement protocol MP1* from a medical imaging apparatus of a first type and serves to adjust this measurement protocol to a medical imaging apparatus of a second type. The measurement protocol MP1* is transferred to a test processor 82 which examines whether the measurement parameters used by the medical imaging apparatus of a second type are included in one of the classes encompassed by the measurement protocol MP1*. If that is not the case, the measurement protocol MP1* is transferred to a class generating unit 83 which generates one or more classes with the measurement parameters used. The possibly altered measurement protocol MP2* adjusted to the medical imaging apparatus of a second type is then transferred to an output interface 84 for output of the measurement protocol MP2*.

Figure 9:
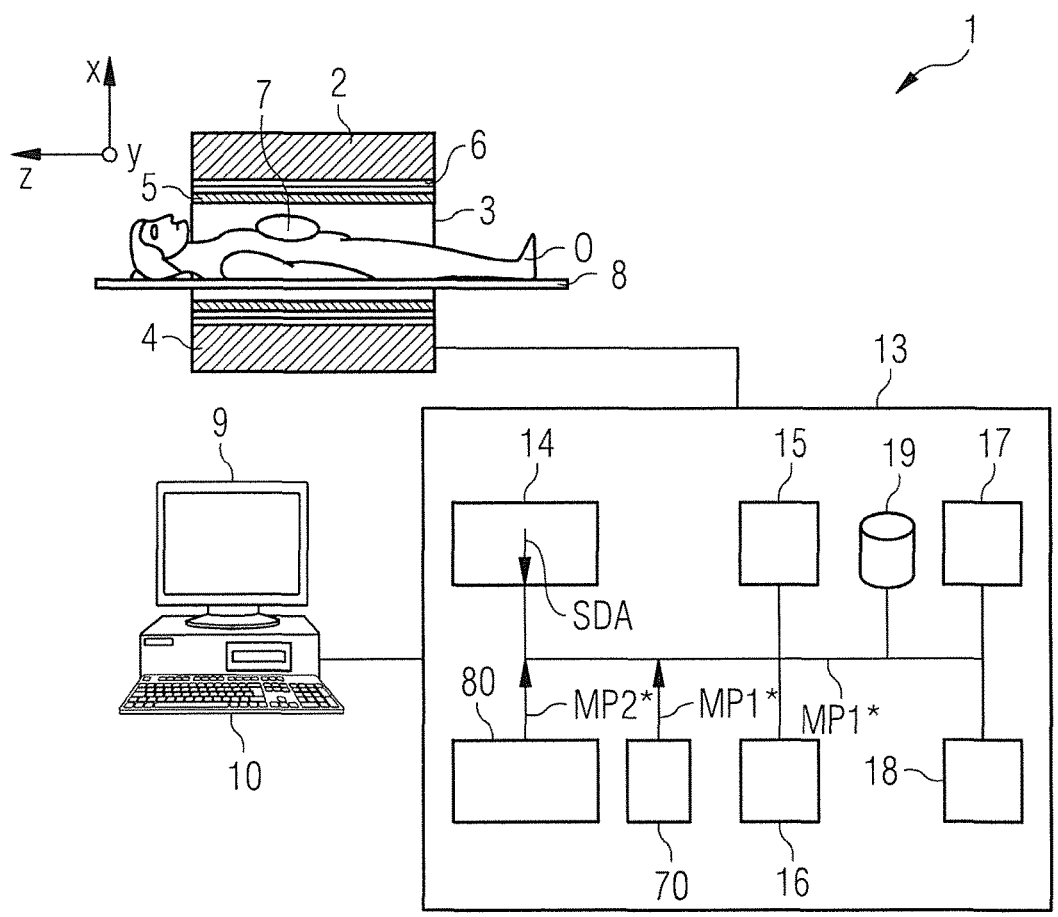
FIG. 9 is a schematic illustration of a magnetic resonance tomography system according to an exemplary embodiment of the invention.

FIG. 9 provides a schematic illustration of a magnetic resonance system 1 according to the invention (hereinafter "MR system" for short). This has the actual magnetic resonance scanner 2 with an examination area 3 or patient tunnel, into which an object under examination O, or here a patient or subject, on a bed or platform 8 can be moved, in the body of which the object under examination or the examination area, for example, a particular organ, is located.

The magnetic resonance scanner 2 is equipped in the customary manner with a basic field magnet system 4, a gradient system 6 and an RF-transmitting antenna system 5 and an RF-receiving antenna system 7. In the exemplary embodiment shown, the RF-transmitting antenna system 5 is a fixed whole body coil in the magnetic resonance scanner 2, whereas the RF-receiving antenna system 7 consists of local coils arranged on the patient or subject (in FIG. 9 only symbolized by a single local coil 7). In principle, however, the whole body coil can be used as an RF-receiving antenna system and the local coils as an RF-transmitting antenna system, provided that these coils can each be switched to different operating modes.

Furthermore, the MR system 1 has a central control computer 13, which is used to control the MR system 1. This central control computer 13 has a sequence controller 14 for pulse sequence control. With this, the sequence of radio-frequency pulses (RF pulses) and gradient pulses is controlled as a function of a selected imaging sequence. Such an imaging sequence can be specified, for example, in a measurement or control protocol MP1*. Usually, various control protocols for different measurements are stored in a storage device 19 and can be selected by an operator (and possibly changed, if necessary) and then used to perform the measurement.

To radiate the individual RF pulses, the central control computer 13 has a radio-frequency transmission device 15 that generates, amplifies and feeds the RF pulses into the RF-transmitting antenna system 5 via an appropriate interface (not shown in detail). To control the gradient coils of the gradient system 6, the control computer 13 has a gradient system interface 16. The sequence controller 14 communicates appropriately, for example, by emitting SDA sequence control data, with the radio-frequency transmission device 15 and the gradient system interface 16 for emitting pulse sequences. The control computer 13 also has a radio-frequency receiving device 17 (likewise communicating appropriately with the sequence controller 14) to acquire magnetic resonance signals received from the RF receiving antenna system 7 in a coordinated manner, i.e. raw data. A reconstruction processor 18 accepts the acquired raw data from which it reconstructs the MR image data. This image data can then, for example, be stored in a memory 19.

Furthermore, the control computer 13 also has a measurement protocol generation device 70 to generate a measurement protocol MP1* in the manner described in connection with FIG. 5. The measurement protocol can then be transferred to the sequence controller 14 to initiate an MR-image recording pulse sequence with the output of SDA sequence control data.

If a measurement protocol MP1* is transferred to the control computer 13 from another MR system (not shown), this measurement protocol MP1* is first forwarded to a measurement protocol conversion device 80 according to the invention, as illustrated in detail in FIG. 8. In the manner described in connection with FIG. 6, the measurement protocol conversion device 80 examines whether changes in the received measurement protocol MP1* must be undertaken, and then generates an adjusted measurement protocol MP2*. Afterwards, the adjusted measurement protocol MP2* is transferred to the sequence controller 14 to initiate an MR image recording pulse sequence with the output of SDA sequence control data.

The operation of the central control computer 13 can take place via a terminal with an input unit 10 and a display unit 9, from which the entire MR system 1 can be operated by an operator. MR images can also be displayed on the display unit 9, and via the input unit 10, possibly in combination with the display unit 9, measurements can be planned and initiated with suitable measuring sequences as noted, and suitable control protocols selected and, if necessary, modified.

The MR system 1 according to the invention and the control computer 13 may furthermore have a multiplicity of further components not shown in detail herein, but usually present on such devices, such as a network interface in order to connect the entire system to a network and raw data and/or image data, but also to be able to exchange additional data such as, for example, patient-relevant data or control protocols.

The manner by which suitable raw data are acquired and MR images are reconstructed through the emission of RF pulses and the generation of gradient fields is known to those skilled in the art, in principle, and thus need not be explained in more detail herein. Likewise, various measuring sequences such as spin echo sequences or gradient echo sequences, EPI-measuring sequences or measuring sequences for the generation of diffusion-weighted images, are known to those skilled in the art, in principle.

Finally, it is noted once again that the aforementioned methods and devices are only preferred exemplary embodiments of the invention and that the invention can be varied by those skilled in the art without departing from the scope of the invention. The invention is not restricted to application on MR systems but the invention can, in principle, also be applied to the recording of CT images. The term "unit" does not preclude such an item from being formed by several components, which may be spatially distributed.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a measurement protocol for medical imaging of a subject, said medical imaging to be implemented using a medical imaging apparatus that comprises hardware apparatus components, said method comprising:

providing a computer with a plurality of measurement parameters that are to be formulated into said measurement protocol;

in said computer, dividing said measurement parameters into a protocol structure comprising a base class, consisting of hardware-independent measurement parameters that are independent of said hardware apparatus components, and at least one class that supplements said base class that consists of hardware-specific measurement parameters that specify a feature of at least one of said hardware apparatus components;

in said computer, formulating said measurement protocol from said measurement parameters with said measurement parameters in said base class being treated differently in the formulation of the measurement protocol than the measurement parameters in said at least one class that supplements said base class, thereby obtaining a formulated measurement protocol, wherein the different treatment of the measurement parameters in said at least one class that supplements said base class includes evaluating said hardware-specific measurement parameters based on one or more characteristics of said medical imaging apparatus or of said hardware apparatus components therein, said formulating of said measurement protocol being based on said evaluation; and making the formulated measurement protocol available from the computer in electronic form with a format configured to operate the medical imaging apparatus to execute said medical imaging according to said formulated measurement protocol.

2. A method as claimed in claim 1 wherein said hardware-independent measurement parameters consist of clinical measurement parameters.

3. A method as claimed in claim 2 wherein said clinical measurement parameters are selected from the group consisting of a field of view of said medical imaging apparatus for obtaining medical imaging data, a slice thickness of the subject from which medical image data are to be acquired, a distance between perspective slices in the subject from which medical image data are to be acquired, an echo time of a magnetic resonance pulse sequence for acquiring medical imaging data from the subject, a repetition time of a pulse sequence for acquiring medical image data from the subject, an orientation of the subject with respect to the medical imaging apparatus, a sequence of pulses in said measurement protocol, an image resolution of image data for said medical imaging, and a flip angle of radio-frequency pulses to be radiated by said medical imaging apparatus in the execution of said measurement protocol.

4. A method as claimed in claim 1 wherein said medical imaging apparatus is a magnetic resonance apparatus comprising a radio-frequency coil, a gradient coil arrangement, a radio-frequency amplifier, and a basic field magnet that generates a basic magnetic field, and wherein said method comprises, in said computer, dividing said measurement parameters into said base class and into a plurality of classes that supplements said base class, and assigning respectively separate classes for measurement parameters defining respective coil types of said radio-frequency coil, defining coil parameters of said radio-frequency coil, defining gradient parameters of gradients to be generated by said gradient coil arrangement, defining radio-frequency amplifier parameters of said radio-frequency amplifier, and defining field strength parameters of said basic magnetic field.

5. A method as claimed in claim 1 comprising, in said control computer, adding additional general parameters to said measurement protocol, and dividing said additional general parameters into hardware-independent general parameters and hardware-dependent general parameters, and defining a base class for said hardware-independent general parameters and at least one further class that supplements said hardware-independent general parameter base class, comprising said hardware-dependent general parameters.

6. A method as claimed in claim 1 comprising, in said computer, generating manifestations that are each assigned to an individual type of medical imaging apparatus or a special type of a functional unit of said medical imaging apparatus.

7. A method as claimed in claim 6 wherein said medical imaging apparatus is a magnetic resonance apparatus, and wherein said functional units comprise radio-frequency coils, gradient coils, gradient amplifiers, and radio-frequency amplifiers.

8. A method as claimed in claim 7 wherein said medical imaging apparatus operates according to a software version of operating software, and comprising, in said computer, including parameters that are dependent on said software version in the formulated measurement protocol, with parameters that are valid for all software versions being divided into a basic software parameter class, and parameters that are valid for only some of said software versions are divided into parameter classes that supplement the base class of software parameters that are valid for all of the software versions.

9. A method as claimed in claim 1 wherein said formulating comprises adapting the measurement parameters in said at least one class that supplements said base class to provide adapted measurement parameters and generating at least one further class that supplements said base class and includes said adapted measurement parameters.

10. A method as claimed in claim 1 wherein said at least one class that supplements said base class comprises a plurality of classes that supplements said base class that respectively include measurement parameters defining one or more coil types, one or more coil parameters, one or more gradient parameters of gradients to be generated by a gradient coil arrangement of said medical imaging apparatus, one or more radio-frequency amplifier parameters of a radio-frequency amplifier of said medical imaging apparatus, and one or more field strength parameters of a basic magnetic field generated by said medical imaging apparatus.

11. A method as claimed in claim 1 wherein said medical imaging apparatus operates according to a software version of operating software, the method further comprising:
in said computer, including parameters that are dependent on said software version in the formulated measurement protocol, with parameters that are valid for all software versions being divided into a basic software parameter class, and parameters that are valid for only some of said software versions are divided into parameter classes that supplement the base class of software parameters that are valid for all of the software versions.

12. A method for transferring a measurement protocol from a medical imaging device of a first type to a medical imaging device of a second type, said method comprising:
providing a computer with a plurality of measurement parameters that are to be formulated into a measurement protocol for medical imaging of a subject, said medical imaging to be implemented using said medical imaging device of said first type that comprises hardware apparatus components;
in said computer, dividing said measurement parameters into a protocol structure comprising a base class, consisting of hardware-independent measurement parameters that are independent of said hardware apparatus components, and at least one class that supplements said base class that consists of hardware-specific measurement parameters that specify a feature of at least one of said hardware apparatus components;
in said computer, formulating said measurement protocol from said measurement parameters with said measurement parameters in said base class being treated differently in the formulation of the measurement protocol than the measurement parameters in said at least one class that supplements said base class, thereby obtaining a formulated measurement protocol, wherein the different treatment of the measurement parameters in said at least one class that supplements said base class includes formulating said at least one class that supplements said base class based on one or more characteristics of said medical imaging device of said first type or of said hardware apparatus components therein;
in said computer, examining whether a hardware-specific measurement parameter used by the medical imaging device of the second type is included in said at least one class encompassed by the formulated measurement protocol;
generating, based on said examination, at least one further class with hardware-specific measurement parameters that supplements the base class and is associated with the medical imaging device of the second type to generate a modified measurement protocol including said base class, said at least one class that supplements said base class, and said at least one further class; and
emitting the modified measurement protocol from the computer in electronic form targeted for use by said medical imaging device of the second type.

13. A computer for generating a measurement protocol for medical imaging of a subject, said medical imaging to be implemented using a medical imaging apparatus that comprises hardware apparatus components, said computer comprising:
an input interface configured to receive a plurality of measurement parameters that are to be formulated into said measurement protocol;
a processor configured to divide said measurement parameters into a protocol structure comprising a base class, consisting of hardware-independent measurement parameters that are independent of said hardware apparatus components, and at least one class that supplements said base class that consists of hardware-specific measurement parameters that specify a feature of at least one of said hardware apparatus components;
said processor being configured to formulate said measurement protocol from said measurement parameters with said measurement parameters in said base class being treated differently in the formulation of the measurement protocol than the measurement parameters in said at least one class that supplements said base class, thereby obtaining a formulated measurement protocol, wherein the different treatment of the measurement parameters in said at least one class that supplements said base class includes evaluating said hardware-specific measurement parameters based on one or more characteristics of said medical imaging apparatus or of said hardware apparatus components therein, said formulating of said measurement protocol being based on said evaluation; and
an output interface configured to make the formulated measurement protocol available from the processor in electronic form with a format configured to operate the medical imaging apparatus to execute said medical imaging according to said formulated measurement protocol.

14. A computer for transferring a measurement protocol from a medical imaging device of a first type to a medical imaging device of a second type, said method comprising:

an input interface configured to receive a plurality of measurement parameters that are to be formulated into a measurement protocol for medical imaging of a subject, said medical imaging to be implemented using said medical imaging device of said first type that comprises hardware apparatus components;

a processor configured to divide said measurement parameters into a protocol structure comprising a base class, consisting of hardware-independent measurement parameters that are independent of said hardware apparatus components, and at least one class that supplements said base class that consists of hardware-specific measurement parameters that specify a feature of at least one of said hardware apparatus components;

said processor being configured to formulate said measurement protocol from said measurement parameters with said measurement parameters in said base class being treated differently in the formulation of the measurement protocol than the measurement parameters in said at least one class that supplements said base class, thereby obtaining a formulated measurement protocol, wherein the different treatment of the measurement parameters in said at least one class that supplements said base class includes formulating said at least one class that supplements said base class based on one or more characteristics of said medical imaging device of said first type or of said hardware apparatus components therein; and said processor being configured to examine whether a hardware-specific measurement parameter used by the medical imaging device of the second type is included in said at least one class encompassed by the formulated measurement protocol;

said processor being configured generate, based on said examination, at least one further class with hardware-specific measurement parameters that supplements the base class and is associated with the medical imaging device of the second type to generate a modified measurement protocol including said base class, said at least one class that supplements said base class, and said at least one further class; and an output interface configured to emit the modified measurement protocol from the processor in electronic form targeted for use by said medical imaging device of the second type.

15. A medical imaging apparatus for medical imaging of a subject, said medical imaging apparatus comprising:

hardware apparatus components;

a computer provided with a plurality of measurement parameters that are to be formulated into a measurement protocol for said medical imaging;

said computer being configured to divide said measurement parameters into a protocol structure comprising a base class, consisting of hardware-independent measurement parameters that are independent of said hardware apparatus components, and at least one class that supplements said base class that consists of hardware-specific measurement parameters that specify a feature of at least one of said hardware apparatus components;

said computer being configured to formulate said measurement protocol from said measurement parameters with said measurement parameters in said base class being treated differently in the formulation of the measurement protocol than the measurement parameters in said at least one class that supplements said base class, thereby obtaining a formulated measurement protocol, wherein the different treatment of the measurement parameters in said at least one class that supplements said base class includes evaluating said hardware-specific measurement parameters based on one or more characteristics of said medical imaging apparatus or of said hardware apparatus components therein, said formulating of said measurement protocol being based on said evaluation; and said computer being configured to make the formulated measurement protocol available from the computer in electronic form with a format configured to operate the medical imaging apparatus to execute said medical imaging according to said formulated measurement protocol.

16. A non-transitory, computer-readable data storage medium encoded with programming instructions, said storage medium being loaded into a computer of a medical imaging apparatus and said programming instructions causing said computer to:

receive a plurality of measurement parameters that are to be formulated into a measurement protocol for medical imaging of a subject, said medical imaging to be implemented using a medical imaging apparatus that comprises hardware apparatus components;

divide said measurement parameters into a protocol structure comprising a base class, consisting of hardware-independent measurement parameters that are independent of said hardware apparatus components, and at least one class that supplements said base class that consists of hardware-specific measurement parameters that specify a feature of at least one of said hardware apparatus components;

formulate said measurement protocol from said measurement parameters with said measurement parameters in said base class being treated differently in the formulation of the measurement protocol than the measurement parameters in said at least one class that supplements said base class, thereby obtaining a formulated measurement protocol, wherein the different treatment of the measurement parameters in said at least one class that supplements said base class includes evaluating said hardware-specific measurement parameters based on one or more characteristics of said medical imaging apparatus or of said hardware apparatus components therein, said formulating of said measurement protocol being based on said evaluation; and make the formulated measurement protocol available from the computer in electronic form with a format configured to operate the medical imaging apparatus to execute said medical imaging according to said formulated measurement protocol.

* * * * *